United States Patent [19]
Osiander et al.

[11] Patent Number: 5,998,995
[45] Date of Patent: Dec. 7, 1999

[54] MICROELECTROMECHANICAL (MEMS)-BASED MAGNETOSTRICTIVE MAGNETOMETER

[75] Inventors: Robert Osiander, Ellicott City; Scott A. Ecelberger, Crownsville; Robert B. Givens, Silver Spring; Dennis K. Wickenden, Woodbine; John C. Murphy, Clarksville; Thomas J. Kistenmacher, Baltimore, all of Md.

[73] Assignee: The Johns Hopkins University, Baltimore, Md.

[21] Appl. No.: 08/944,625

[22] Filed: Oct. 3, 1997

[51] Int. Cl.⁶ .................................................. G01R 33/02
[52] U.S. Cl. ....................... 324/259; 324/244.1; 324/260
[58] Field of Search ..................................... 324/209, 244, 324/244.1, 249, 259, 260, 228, 235, 96; 73/DIG. 2

[56] References Cited

U.S. PATENT DOCUMENTS

| | | | |
|---|---|---|---|
| 5,103,174 | 4/1992 | Wandass et al. ........................ | 324/244 |
| 5,442,288 | 8/1995 | Fenn et al. ........................... | 324/260 X |
| 5,552,778 | 9/1996 | Schrott et al. .......................... | 324/252 |
| 5,623,205 | 4/1997 | Tomita et al. .......................... | 324/244 |
| 5,739,686 | 4/1998 | Naughton et al. .................. | 324/260 X |

*Primary Examiner*—Gerard Strecker
*Attorney, Agent, or Firm*—Francis A. Cooch

[57] ABSTRACT

A microelectromechanical-based magnetostrictive magnetometer that uses, as an active element, a commercial (001) silicon microcantilever coated with an amorphous thin film of the giant magnetostrictive alloy Terfenol-D and a compact optical beam deflection transduction scheme. A set of Helmholtz coils is used to create an ac magnetic excitation field for driving the mechanical resonance of the coated microcantilever. When the coated microcantilever is placed in a dc magnetic field, the dc field will change the amplitude at the mechanical resonance of the coated microcantilever thereby causing a deflection that can be measured. The magnetometer has been demonstrated with a sensitivity near 1 $\mu$T.

10 Claims, 1 Drawing Sheet

MICROELECTROMECHANICAL (MEMS)-BASED MAGNETOSTRICTIVE MAGNETOMETER

STATEMENT OF GOVERNMENTAL INTEREST

This invention was made with Government support under Contract No. N00039-95-C-0002 awarded by the Department of the Navy. The Government has certain rights in the invention.

BACKGROUND OF THE INVENTION

The invention relates to magnetometers and, more specifically, comprises a microelectromechanical (MEMS)-based magnetostrictive magnetometer based on the deflection of a Terfenol-D coated single-crystal silicon cantilever for measuring a dc magnetic field with a sensitivity near 1 $\mu$T.

Interest is increasing in the development of miniature magnetometers for mapping magnetic fields in extraterrestrial, industrial, biomedical, oceanographic, and environmental applications. The many potential uses of such instruments include the following:

Space physics—for the measurement of absolute field levels and curl of interplanetary space (using suitable arrays of sensors) and satellite-generated fields.

Oceanography—for the detection of ships, mineral deposits, and other magnetic objects.

Biomedicine—for the imaging of magnetic patterns, and, for example, tracking the location and orientation of instruments in microsurgery (the latter will be particularly helpful as the technology moves more to robotic or tele-operated systems).

Environmental science—for the imaging or detection of magnetic fields on the earth's surface or in the atmosphere, for example, in the detection of pipeline corrosion.

Transportation—for the measurement of deflections in crash test experiments and as one of the many sensors in automatically piloted road vehicles.

The trend in magnetometer design and development is constantly toward smaller size, lower power consumption, and lower cost for similar performance. To meet these objectives, recent innovations have included the use of piezoresistive cantilevers and magnetometers based on electron-tunneling effects.

A reported piezoresistive device consists of a single-crystal silicon cantilever, 200 mm long, onto the end of which is glued a small (700 ng) grain of magnetic material. Measurements performed either at low temperature (59.1 K) with a microcrystal of a high-critical-temperature superconductor or at room temperature with a small iron crystal gave sensitivities of 5 and 50 mT, respectively.

A magnetometer based on electron tunneling is bulk-micromachined from silicon. It consists of a silicon substrate on which a fixed electron tunneling tip is etched and a deflection electrode is deposited, and is bonded to a low-stress silicon nitride membrane (2.5×2.5 mm). The deflection of the membrane is caused by the Lorentz force induced between the applied fields and the current flowing in a multiloop conductor deposited on top of the membrane. To date, it has been possible to produce only a single loop, resulting in a preliminary noise equivalent magnetic field of only 6 $\mu$T√Hz.

As can be seen, the sensitivities of the above magnetometers, defined as the minimum detectable field change, are generally in the range of 1 $\mu$T to 1 mT, corresponding to $10^{-2}$ to 10 Oe. There is still the need, then, for small, low-cost, low-power-consumption magnetometers with sensitivities capable of meeting the potential applications discussed above.

SUMMARY OF THE INVENTION

The microelectromechanical (MEMS)-based magnetometer of the invention designed on the magnetoelastic effect fulfills the need for sensitive, small, low-cost and low-power-consumption capabilities missing in current devices. The active transduction element is a silicon microcantilever coated with an amorphous thin film of the giant magnetostrictive alloy Terfenol-D.

In addition to the magnetostrictive transducer, basic components of the magnetometer include: (a) mechanical resonance of the coated-microcantilever through coupling to an ac magnetic field induced in coils wound around a Lexan spindle; and (b) detection by optical beam deflection of the microcantilever motion utilizing a laser diode source and a position-sensitive detector. The Lexan forms house a second, parallel set of coils that serve as a dc field and bias supply, with an approximate field of 2 $\mu$T/mA. The Lexan cradle with a core diameter at 2 cm and a coil separation of 1 cm approximates a Helmholtz configuration for the bias field and sets the size of the active magnetometer elements.

Currently, the sensitivity of the MEMS-based magnetostrictive magnetometer of the invention is ~1 $\mu$T.

DETAILED DESCRIPTION OF THE INVENTION

Figure 1:
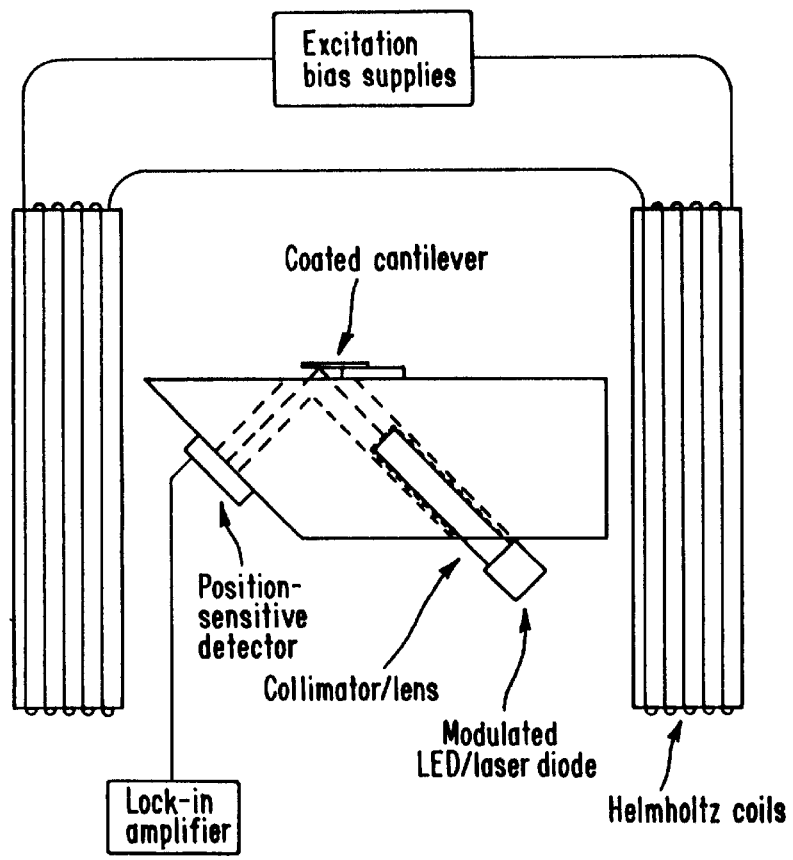
FIG. 1 illustrates the microelectromechanical-based magnetostrictive magnetometer of the invention.

When a polycrystalline ferromagnetic sample is placed in a magnetic field, it either elongates or contracts along the field direction and does the opposite in the transverse direction, to maintain an almost constant volume. Such changes in dimension, below the Curie temperature, are caused by rotation of the magnetic domains in the material and are called magnetostriction.

For most ferromagnetic materials, including nickel and iron, the magnetostriction coefficients are quite small and range from ±10 to 100 ppm in fields on the order of 0.5 T. However, giant magnetostriction, with magnetostriction coefficients up to 0.2%, has been observed in numerous rare-earth/iron alloys, including Terfenol-D [($Dy_{0.7}Te_{0.3}$)$Fe_2$]. A number of applications for such alloys have been anticipated and include surface acoustic wave devices, actuators, and magnetic sensors.

Whereas device applications are envisioned in bulk, ribbon, and thin-film forms, the latter is advantageous for the production of miniaturized magnetometers for a variety of reasons. The shape of the magnetostriction/applied field curve is sigmoidal with very little magnetostriction at low fields. It tends to make such material unsuitable for low-field magnetometry. However, it has been shown that the shape of the curve depends on whether the sample is in tension or compression, and that, when in tension, a significant gradient exists at low fields. To date, however, no values for the magnetostriction coefficient of Terfenol-D have been quoted for fields lower than 5 mT.

Novel sensors are being developed using surface micromachining of silicon with standard microelectromechanical system (MEMS) fabrication techniques. In the simplest example of surface micromachining, a sacrificial layer of silicon dioxide is deposited or grown on a silicon substrate and patterned using photolithography for selective removal in regions where the mechanical structure is to be attached to the silicon structure. The layer for the mechanical structure (usually polysilicon) is then deposited and patterned. Finally, the sacrificial layer is etched away to release the polysilicon structure.

More complex structures are fabricated using additional layers of materials having the desired properties. For example, one foundry uses three polysilicon and two silicon dioxide sacrificial layers of differing thicknesses deposited on a silicon nitride layer to electrically isolate the structures from the silicon substrate, which enables various structures to be processed, including cantilevers, diaphragms, and actuators.

Various materials can be selectively deposited to produce specific sensor action. For example, for a magnetostrictive magnetometer, a thin film of Terfenol-D is deposited onto a MEMS cantilever. This film will naturally be placed under tension when it is deposited onto a silicon substrate because of the difference in coefficients of thermal expansion. When the completed device is placed in a magnetic field, the magnetostriction of the Terfenol-D causes the cantilever to deflect.

The deflection is a function of the magnetic field strength and can be measured using various transduction schemes, including either optical beam deflection or changes in capacitance. The latter is particularly appropriate to complex devices, since the bottom polysilicon layer, used as one electrode of a parallel plate capacitor, is within a few micrometers of the cantilever, and sensibly sized capacitances can be obtained with relatively small areas. Furthermore, it is possible to incorporate various electronic circuits into the design, and the completed device will be only a few square millimeters in size.

FIG. 1 is an illustration of the magnetostrictive magnetometer of the invention. In one embodiment, the active transduction element is a commercial (001)-oriented single-crystal silicon cantilever. A Terfenol-D film was deposited on the cantilever in a high-vacuum DC-magnetron sputtering system, which uses argon as plasma gas and a polycrystalline target. The film composition was determined by X-ray energy dispersive spectroscopy and shown to be very close to that of the target. The structural properties were ascertained from θ/2θ X-ray diffraction data collected on a powder diffractometer using graphite-monochromatized CuKα radiation. The presence of only broadly diffuse maxima in the diffraction pattern suggested an amorphous film structure.

This amorphous structure is particularly advantageous since it leads to a sharp increase in magnetostriction amplitude at low fields, allows neglect of crystalline anisotropy, offers minimal hysteresis, and yields a room-temperature thermal expansion coefficient apparently near that of (001) silicon. The latter is important since residual strain caused by elevated temperature processing, together with a thermal expansion coefficient mismatch between the film and the cantilever, can lead to significant deformation of the cantilever on cooling to room temperature. Significant residual strain may also affect the temperature stability of working devices.

In operation, the cantilever is driven at its fundamental resonance frequency (typically at $f_o \approx 10$ kHz) by coupling to a magnetic excitation field induced in coils wound around a Lexan spindle. These same Lexan forms house a second, parallel set of coils that serve as a DC field and bias supply, with an approximate field of 2 $\mu$T/mA. The Lexan cradle, with a core diameter of $\approx 2$ cm and a coil separation of $\approx 1$ cm, approximates a Helmholtz configuration and sets the size of the active magnetometer elements shown in FIG. 1.

The advantage of operating the device at resonance is that the displacement x of the resonator as a function of frequency $f$ is proportional to $$\frac{F}{k\sqrt{\left(1-\frac{f^2}{f_0^2}\right)^2 + \left(\frac{1}{Q}\frac{f}{f_0}\right)^2}},$$

where F is the driving force, k is the restoring force, and the quality factor Q is a measure of the damping force. Thus, at resonance the displacement is increased by a factor of Q over a static system.

The field-induced deflection was sensed using the compact optical beam deflection technique depicted in FIG. 1. The output of a laser diode, modulated at a frequency $f_1$, was coupled into a multimode fiber-optic cable; the cleaved end of the cable was positioned close ($\approx 100$ $\mu$m) under the tip of the cantilever. The deflected beam was captured by a position-sensitive detector (PSD) whose output was monitored by a lock-in amplifier at the difference frequency $f_1 - f_o$.

In a typical field detection protocol, the peak-to-peak amplitude of the ac excitation field was set to 50 $\mu$T, and the dc external field was cycled ($\pm 2$-mT limits) over several full hysteresis loops ($M_s \approx 8.3$ kG; $H_o \approx 8.5$ Oe) and returned to zero. Subsequent ramping of the dc field from zero to a maximum of 200 mT (FIG. 2) yielded a linear dependence, with minimal hysteresis, of the output of the PSD on the magnitude of the external dc magnetic field.

Figure 2:
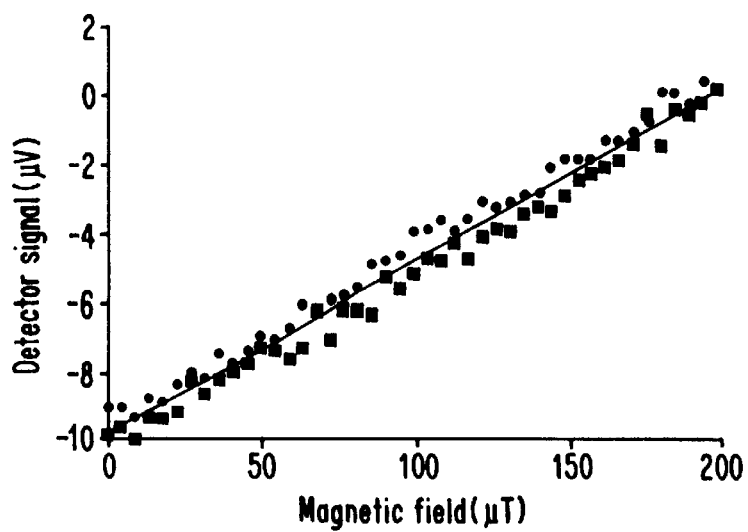
FIG. 2 is a plot showing the response of the invention of FIG. 1 to increasing (circles) and decreasing (squares) dc magnetic field.

From the uncorrected experimental data displayed in FIG. 2, a resolution of $\approx 50$ $\mu$V/mT and a sensitivity near 1 $\mu$T were deduced. Further optimization of the optical detection scheme should increase the sensitivity still further. In addition, data from numerous runs also suggest a very high mechanical and thermomagnetic stability for the magnetostrictive magnetometer of the invention.

The above results represent state of the art for a MEMS-based magnetometer and, importantly, demonstrate for the first time that Terfenol-D has a measurable magnetostrictive coefficient at magnetic fields at the millitesla level. The invention offers a number of advantages for device applications: (a) small size, (b) high sensitivity, (c) potential integration on a silicon chip, and (d) vector capability.

Many applications are envisioned for a fully miniaturized version of this magnetostrictive magnetometer. In space science applications, for example, measurement of the magnitude, vector orientation, and spatial derivatives of extraterrestrial magnetospheres are of interest, as well as the characterization of the magnetic signature of the parent spacecraft itself.

We claim:

1. A microelectromechanical system (MEMS)-based magnetometer comprising:
   a microcantilever fabricated using MEMS techniques;
   a magnetostrictive material coating the microcantilever, the material being placed under tension thereby;
   a first set of coils around the coated microcantilever for creating an ac magnetic excitation field for driving the mechanical resonance of the coated microcantilever;

whereby, when the coated microcantilever is placed in a dc magnetic field, the dc field will change the amplitude at the mechanical resonance of the coated microcantilever being driven by the ac magnetic field thereby causing a deflection in the coated microcantilever.

2. The magnetometer as recited in claim 1, wherein the magnetostrictive material comprises an amorphous thin film.

3. The magnetometer as recited in claim 2, wherein the thin film comprises Terfenol-D.

4. The magnetometer as recited in claim 1, wherein the microcantilever comprises silicon.

5. The magnetometer as recited in claim 1, further comprising a means for detecting the deflection in the coated microcantilever.

6. The magnetometer as recited in claim 5, further comprising a second set of coils, the second set of coils being parallel to the first set of coils, the second set of coils providing a dc field and a bias supply.

7. A microelectromechanical system (MEMS)-based method for measuring a dc magnetic field comprising the steps of:

coating a microcantilever fabricated using MEMS techniques with a magnetostrictive material, the material being placed under tension thereby;

placing the coated microcantilever in an ac magnetic excitation field to drive the mechanical resonance of the coated microcantilever;

exposing the coated microcantilever to a dc magnetic field to be measured thereby changing the amplitude at the mechanical resonance of the microcantilever being driven by the ac magnetic excitation field; and measuring the change in amplitude thereby measuring the dc magnetic field.

8. The method as recited in claim 7, wherein the magnetostrictive material comprises an amorphous thin film.

9. The magnetometer as recited in claim 8, wherein the thin film comprises Terfenol-D.

10. The magnetometer as recited in claim 9, wherein the microcantilever comprises silicon.

* * * * *